(12) United States Patent
Schiavone et al.

(10) Patent No.: US 7,259,112 B1
(45) Date of Patent: Aug. 21, 2007

(54) METHOD FOR MINIMIZING CORNER EFFECT BY DENSIFYING THE INSULATING LAYER

(75) Inventors: Patrick Schiavone, Villard-Bonnot (FR); Frédéric Gaillard, Voiron (FR)

(73) Assignee: Fahrenheit Thermoscope, LLC, Las Vegas, NV (US)

( * ) Notice: Subject to any disclaimer, the term of this patent is extended or adjusted under 35 U.S.C. 154(b) by 0 days.

(21) Appl. No.: 09/462,716

(22) PCT Filed: Jul. 8, 1998

(86) PCT No.: PCT/FR98/01475

§ 371 (c)(1),
(2), (4) Date: Aug. 6, 2001

(87) PCT Pub. No.: WO99/03148

PCT Pub. Date: Jan. 21, 1999

(30) Foreign Application Priority Data

Jul. 8, 1997 (FR) .................................. 97 08642

(51) Int. Cl.
*H01L 21/31* (2006.01)
*H01L 21/469* (2006.01)
(52) U.S. Cl. .............................. 438/788; 257/E21.278; 257/E21.079
(58) Field of Classification Search .................. 638/788
See application file for complete search history.

(56) References Cited

FOREIGN PATENT DOCUMENTS

EP 0199965 * 3/1986

OTHER PUBLICATIONS

Seward et al, Densification of Synthetic fused Silica under ultraviolet irradiation, Journal of Non-Crystalline Solids 222 (1997) 407-414.*

* cited by examiner

*Primary Examiner*—Alexander Ghyka

(57) ABSTRACT

The invention concerns a method for minimizing "corner" effects in shallow silicon oxide trenches, by densifying the silicon oxide layer after it has been deposited in the trenches. Said densification is preferably carried out by irradiating the layer under luminous radiation with weak wavelength.

6 Claims, 1 Drawing Sheet

METHOD FOR MINIMIZING CORNER EFFECT BY DENSIFYING THE INSULATING LAYER

Figure 1:
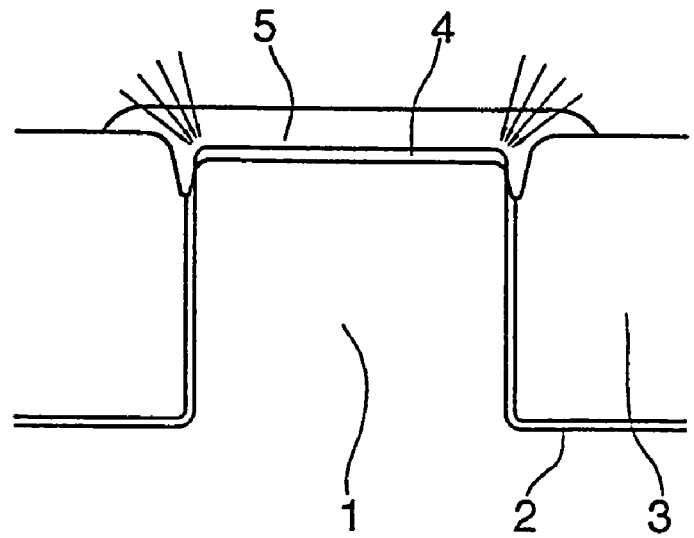

The invention concerns integrated circuit fabrication technologies and in particular the production of MOS transistors.

In existing small dimensional technologies, shallow trench insulation (STI) (or BOX) techniques are preferably used for lateral insulation of active areas and in particular lateral insulation of MOS transistors. These techniques combine etching trenches disposed laterally relative to the future active areas and filling said trenches with an insulative material such as silicon oxide. The insulative layer is flattened before depositing the gate when manufacturing MOS transistors. The trenches are generally filled by depositing the insulative material onto a previously formed layer of thermal oxide.

The successive oxidation and sacrificial deoxidation operations of the insulation method which precede the deposition of the gate tend to uncover so-called "corner" areas of the future active areas. The expression "corner area" therefore refers to the abrupt transition between an insulation area and an active area. Uncovering them is significantly accentuated if some of the insulative oxide is consumed during the operation of flattening the insulative layer filling the trenches.

The appearance of these "corner" areas encourages concentration of the field lines at the top corner of the active area and thus the formation of a spurious transistor. Three transistors are therefore formed, namely the main transistor in the centre and two spurious "corner" transistors. The latter have a lower threshold voltage than the main transistor and therefore begin to conduct before it. This phenomenon leads to an increase in the current consumed before effective operation of the transistor.

One way to improve the electrical qualities of the lateral insulation and in particular the concentration of the field lines in the corner areas at the top corners of the active area is to maintain the oxide at the same level as the active area. The oxide deposited must therefore have a density close to that of the silica. Given the structure of silicon oxides (xerogel structure) used for filling shallow trenches, it is necessary to anneal them at a very high temperature (>1200° C.) or to use some other technique with a very low thermal balance to densify them.

It is therefore necessary to determine a way to eliminate or at least significantly reduce this unwanted "corner" effect.

The inventors have now discovered that it is possible to reduce significantly the "corner" effect that has previously degraded the electrical properties of MOS transistors without inducing additional problems into the manufacture of such transistors.

The object of the invention is therefore a method of minimizing the "corner" effect in shallow trenches of silicon oxide for lateral insulation of active areas, whose essential feature is the densification of the layer of silicon oxide deposited in said lateral trenches.

These silicon oxides are densified in accordance with the invention by irradiating said insulative layer with short wavelength light. This technique maintains a low thermal balance of the operation.

The technique has the additional advantage that it can easily be used within an MOS transistor fabrication process.

According to a preferred aspect of the invention, the insulative oxide layer is irradiated with light at a wavelength less than or equal to 200 nm with a number of photons per $cm^2$ greater than $10^{19}$ and an energy at least equal to 9 eV.

More particularly, the light used has a wavelength of approximately 100 nm.

The oxide layer deposited in the insulating trenches can be densified directly after depositing the insulative layer or after flattening it.

To prevent the "corner" area being uncovered during flattening of the insulative oxide deposited in the trenches, the densification is preferably performed directly after depositing the oxide into the shallow trenches.

Figure 2:
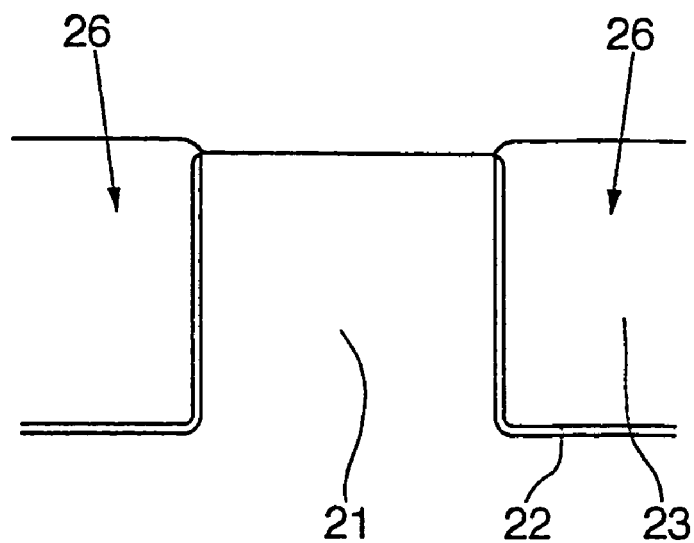

Other advantages and features of the invention will become apparent on examining the following detailed description of embodiments of the invention, which is given by way of non-limiting example only, and the accompanying drawings, in which:

FIG. 1 is a diagram showing an MOS transistor manifesting the "corner" effect, and FIG. 2 is a diagram showing a device in accordance with the invention before depositing the gate.

In FIG. 1, an active area 1 has received lateral insulation by a prior art method, after which a gate 5 has been deposited on said active area in order to form an MOS transistor.

The conventional process forms shallow trenches laterally relative to a predetermined area intended subsequently to form an active area 1 of the semi-conductor device. A thin layer 2 of thermal oxide is then applied to the flanks and the bottom of the trench, which constitutes a good interface between the substrate of the active area and the insulation. The next step consists in depositing a layer 3 of silicon oxide into the trenches to fill them. The active areas are generally protected during this process by a protective mask deposited onto the surface of said active areas. This is why, after flattening the oxide layer and removing the mask protecting the active areas, the height of the oxide layer 3 deposited in the lateral trenches is slightly greater than the height of the active area 1.

The steps of the process of fabricating the semi-conductor device uncover the top corners of the active area 1. A thin oxide gate layer 4 is formed on the semi-conductor device, onto which the gate 5 is deposited, overlapping the insulation area. The process of fabricating the MOS transistor then continues in the conventional manner. When the transistor obtained is activated, concentration of the field lines in the "corner" areas is observed and leads to the formation of two spurious transistors at respective ends of the gate.

FIG. 2 shows the semi-conductor device obtained by the method of the invention in the step immediately preceding the formation of the gate oxide and the deposition of the gate. Note that no "corner" areas have been uncovered, in contrast to the previous figure.

After etching trenches 26 disposed laterally relative to the future active areas 21 (only one of which is shown in the figure), using a conventional process, a layer 22 of thermal oxide is formed on the walls and the bottom of the trenches and the surface of the active areas 21. At least one insulative silicon oxide layer 23 is then deposited in the trenches 26 in a conventional manner, for example by CVD. The thickness of this layer is such that all the trenches of the wafer are filled perfectly.

The future active areas are usually covered with a protective mask during the insulation process to keep their surface intact. The thickness of the insulation deposited in the trenches is then at least equal to the height of the active area (depth of the trenches) covered with the thermal oxide and the protective mask.

In one embodiment of the invention, the next step is the essential feature of the invention. It consists in densifying the layer 23 of silicon oxide deposited in the trenches 26.

In another embodiment of the invention the insulative layer 23 of silicon oxide is conventionally flattened before densifying it, for example by mechanical/chemical polishing. The densification step is then performed on the flattened oxide layer.

At whichever stage the insulative layer 23 of silicon oxide is densified, in accordance with one particular feature of the invention the densification can be done by irradiating said layer with short wavelength light (e.g. a laser beam or light from a mercury lamp).

The light used for this irradiation generally has a wavelength less than or equal to 200 nm with a number of photons per $cm^2$ of $10^{19}$ and an energy at least equal to 9 eV. Optimum densification is obtained when the wavelength is around 100 nm. The silicon oxide layer 23 deposited in the trenches 26 is thus converted into a denser insulative layer having a structure similar to that of pure silica.

After the densification step, the insulation and MOS transistor fabrication process continues in the conventional manner. FIG. 2 shows diagrammatically the state of the device obtained after flattening the oxide layer, removing the protective masks from the future active areas and deoxidizing the surfaces. A future active area 21 is therefore insulated laterally on each side by shallow trenches 26. The trenches are coated with a thermal oxide layer 22 and filled with at least one flattened insulative layer 23 of densified silicon oxide having a density close to that of the thermal oxide.

The transistor fabrication process then continues in the conventional manner.

The aggressive effect of the successive steps of flattening the insulative layer filling the trenches, removing the protective masks, deoxidizing the surface of the future active areas, etc. is thereby minimized. The "corner" areas of the future active areas are no longer uncovered, as they were previously. When a transistor whose shallow trench insulated areas have been densified in accordance with the invention is activated, there is no longer any concentration of field lines in the "corner" areas. The spurious effect referred to as the "corner" effect is minimized and the electrical properties of MOS transistors made this way are significantly improved without inducing other defects or drawbacks in the manufactured devices.

The method of the invention also has the advantage that it can easily be used on an MOS transistor fabrication line using conventional plant.

What is claimed is:

1. A method, comprising:
   forming a thin layer of thermal silicon oxide along the walls of an active area of a semiconductor device and forming a thin layer of thermal silicon oxide along the walls and bottoms of shallow trenches laterally adjacent to the active area;
   depositing silicon oxide into the shallow trenches;
   irradiating the silicon oxide in the shallow trenches with short wavelength light to densify the silicon oxide;
   forming a thin oxide gate layer on the active area; and
   depositing a gate onto the thin oxide gate layer, wherein the gate overlaps the shallow trenches.

2. The method of claim 1, further comprising irradiating the silicon oxide in the shallow trenches with light at a wavelength less than or equal to 200 nm, with a number of photons per $cm^2$ greater than $10^{19}$, and an energy at least equal to 9 eV.

3. The method of claim 1, wherein the wavelength of the light is approximately 100 nm.

4. The method of claim 1, wherein irradiating the silicon oxide inhibits the formation of corner areas in the active areas.

5. The method of claim 1, further comprising irradiating the silicon oxide in the shallow trenches such that the silicon oxide in the shallow trenches has a density close to the density of the thermal silicon oxide.

6. The method of claim 1, wherein the silicon oxide layer is deposited in the trenches using a chemical vapor deposition (CVD) process.

* * * * *